(12) United States Patent
Larsson et al.

(10) Patent No.: US 11,141,810 B2
(45) Date of Patent: Oct. 12, 2021

(54) NON-EUTECTIC BONDING

(71) Applicant: Techni Holding AS, Borre (NO)

(72) Inventors: Andreas Larsson, Lier (NO); Torleif A. Tollefsen, Drammen (NO)

(73) Assignee: Techni Holding AS, Borre (NO)

( * ) Notice: Subject to any disclaimer, the term of this patent is extended or adjusted under 35 U.S.C. 154(b) by 552 days.

(21) Appl. No.: 15/475,153

(22) Filed: Mar. 31, 2017

(65) Prior Publication Data

US 2017/0282287 A1 Oct. 5, 2017

(30) Foreign Application Priority Data

Mar. 31, 2016 (EP) .................................... 16163263

(51) Int. Cl.
*B23K 20/02* (2006.01)
*H01L 23/00* (2006.01)
(Continued)

(52) U.S. Cl.
CPC ............ *B23K 20/02* (2013.01); *B23K 20/026* (2013.01); *B23K 20/233* (2013.01); *B23K 35/26* (2013.01); *B23K 35/3013* (2013.01); *C22C 5/00* (2013.01); *C22C 19/00* (2013.01); *H01L 24/29* (2013.01); *H01L 24/32* (2013.01); *H01L 24/83* (2013.01); *H01L 2224/0345* (2013.01); *H01L 2224/03462* (2013.01); *H01L 2224/04026* (2013.01); *H01L 2224/05082* (2013.01); *H01L 2224/05083* (2013.01); *H01L 2224/05155* (2013.01); *H01L 2224/05187* (2013.01); *H01L 2224/05644* (2013.01); *H01L 2224/27462* (2013.01); *H01L 2224/29109* (2013.01); *H01L 2224/29144* (2013.01); *H01L 2224/3201* (2013.01); *H01L 2224/32503* (2013.01);
(Continued)

(58) Field of Classification Search
None
See application file for complete search history.

(56) References Cited

U.S. PATENT DOCUMENTS 4,988,036 A * 1/1991 Kemble .................. B23K 1/19
228/197
5,623,127 A   4/1997 Bradley et al.
(Continued)

FOREIGN PATENT DOCUMENTS

CN    100484686    5/2009
CN    102345078    2/2012
(Continued)

OTHER PUBLICATIONS

D6 Weyrich N P: "Joining of metals and ceramics using Au-(Ge, Si)-based solder alloys", DISS. ETH No. 22995, 2015, Zürich, DOI: 10.3929/ethz-a-010603255, Retrieved from the Internet: URL:http://e-collection.library.ethz.ch/eserv/eth:48707/eth-48707-02.pdf.
(Continued)

*Primary Examiner* — Xiaobei Wang
(74) *Attorney, Agent, or Firm* — Christian D. Abel

(57) ABSTRACT

The present invention relates to a method of forming a joint bonding together two solid objects and joints made by the method, where the joint is formed by a layer of a binary system which upon heat treatment forms a porous, coherent and continuous single solid-solution phase extending across a bonding layer of the joint.

6 Claims, 10 Drawing Sheets

(51) Int. Cl.
   *C22C 19/00* (2006.01)
   *C22C 5/00* (2006.01)
   *B23K 35/26* (2006.01)
   *B23K 20/233* (2006.01)
   *B23K 35/30* (2006.01)

(52) U.S. Cl.
   CPC ............... *H01L 2224/8309* (2013.01); *H01L 2224/83075* (2013.01); *H01L 2224/8381* (2013.01); *H01L 2224/8383* (2013.01); *H01L 2224/83101* (2013.01); *H01L 2224/83203* (2013.01); *H01L 2224/83444* (2013.01); *H01L 2224/83455* (2013.01); *H01L 2224/83825* (2013.01); *H01L 2224/83948* (2013.01); *H01L 2224/92* (2013.01); *H01L 2224/94* (2013.01)

(56) References Cited

U.S. PATENT DOCUMENTS

| | | | |
|---|---|---|---|
| 6,854,636 | B2 | 2/2005 | Farooq et al. |
| 2004/0025976 | A1* | 2/2004 | Hubner .............. B23K 35/0244 148/400 |
| 2005/0106059 | A1 | 5/2005 | Farooq et al. |
| 2008/0014460 | A1 | 1/2008 | Riedl |
| 2013/0152990 | A1 | 6/2013 | Lai et al. |
| 2016/0027759 | A1 | 1/2016 | Plossl |

FOREIGN PATENT DOCUMENTS

| | | |
|---|---|---|
| CN | 104404307 | 3/2015 |
| CN | 105103287 | 11/2015 |
| CN | 10317820 | 2/2016 |
| EP | 0365807 | 5/1990 |
| EP | 1720204 | 11/2006 |
| EP | 1722004 | 11/2007 |
| WO | 2004088725 | 10/2004 |

OTHER PUBLICATIONS

Office Action from China Patent Office, submitted inter alia as statement of relevance for non-English references. See Table listing references, all classified as "A" (background art).

D1 "Fazovaya diagramma sistemy Au—Ge", Nov. 8, 2011, Retrieved from the Internet: URL:https://web.archive.org/web/20111108224601/http://www.himlkatus.ru/art/phase-diagr1/Au-Ge.php.
D12 "Index of /ireu/IREU2015/pdf_reports", Retrieved from the Internet: URL:http://www.phys.ufl.edu/ireu/IREU2015/pdf_reports/.
D2 "Fazovaya diagramma sistemy In—Si", Nov. 9, 2011, Retrieved from the Internet: URL:https://web.archive.org/web/20111109010756/http://www.himikatus.ru/art/phase/diagr1/In-Si.php.
D4 "Porpsity", AAPH Wiki, Mar. 3, 2016, Retrieved from the Internet: URL:http://wiki.aapg.org/index.php?title=Porosity&oldid=23703.
D12 Akins D et al: "Thermal Conductivity of Indium Bonded Silicon", Aug. 12, 2015, Retrieved from the Internet: URL:http://www.phys.ufl.edu/ireu/IREU2015/pdf_reports/Dallas_Akins_Roma_Paola_Puppo_Paper.pdf.
D11 Attal et al: "Imaging interior planes by acoustic microscopy", Tenth International Symposium on Acoustical Imaging, Oct. 23-16, 1980, Cannes, France, 1982, pp. 803-815.
D8 Cook III G O et al: "Overview of transient liquid phase and partial transient liquid phase bonding", Journal of Materials Science, Kluwer Academic Publishers, vol. 46, No. 16, May 7, 2011, pp. 5305-5323, ISSN: 1573-4803, DOI: 10.1007/S10853-011-5561-1.
D7 Leinenbach C et al: "Al2O3—Al2O3 and Al2O3-Ti Solder Joints—Influence of Ceramic Metallization and Thermal Pretreatment on Joint Properties", International Journal of Applied Ceramic Technology, vol. 9, No. 4, Mar. 30, 2012, pp. 751-763, ISSN:1546-542X, DOI: 10.1111/j.1744-7402.2012.02769.x.
D3 Ohtani H et al: "A Thermodynammic Study of the Phase Equilibria in the Bi—Sn—Sb System", Journal of Electronic Materials, Springer US, Boston, vol. 23, No. 8, Aug. 1994, pp. 747-755, ISSN: 1543-186X, DOI: 10.1007/BF02651369.
D5 Weyrich N et al: "Low temperature TLP bonding of Al2O3-ceramics using eutectic Au-(Ge, Si) alloys", Journal of Materials Science, vol. 48, No. 20, Jun. 21, 2013, pp. 7115-7124, ISSN: 0022-2461, DOI: 10.1007/s10853-013-7526-z.
D6 Weyrich N P: "Joining of metals and ceramics using Au-(Ge, Si)-based solder alloys", Diss. Eth No. 22995, 2015, Zurich, DOI: 10.3929/ethz-a-010603255, Retrived from the Internet: URL:http://e-collection.library.ethz.ch/eserv/eth:48707/eth-48707-02.pdf.

* cited by examiner

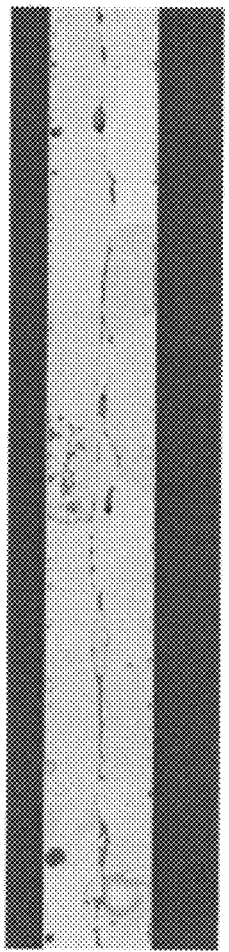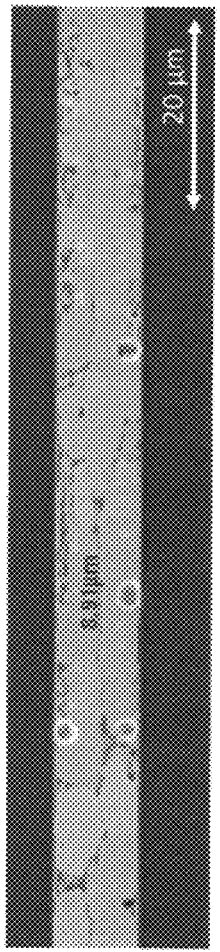
Fig. 7A No annealing
Fig. 7B Annealing 4 hours at 300 °C

NON-EUTECTIC BONDING

FIELD OF THE INVENTION

The present invention relates to a method of forming a joint bonding together two solid components and joints made by the method. The present invention is suited for joining structural, and/or electronic components, in particular as a bonding technology for bonding metallic components and in electronic packaging purposes.

BACKGROUND OF THE INVENTION

Joining materials or components is an ancient art emanating many thousands of years back in time. In more resent time, joining metals have become an art of great importance.

Some of the most advanced technologies for joining metal components in use today are within assembly of complex electronic systems (often referred to as bonding). Examples of typical applications include bonding of electronic components such as e.g.; wide-bandgap semi-conductive devices (e.g. transistors or diodes made from SiC, GaN, GaAs, AlN), micromechanical systems (MEMS), micro-devices, microstructures, capacitors, resistors, inductors onto wafers or other substrates (typically made from a ceramic or glass) and ICs (e.g. based on Si or SiC). Other applications include joining thermoelectric generators (TEG), forming hermetic seals in encapsulations or joining structural components. Bonding include forming interconnects, die attaches and the like within the field of electronics packaging. Such technologies include; soldering, brazing, welding, contact melting, thermo-compression, ultra-sonic, solid liquid inter-diffusion (SLID)/transient liquid phase (TLP) and sintering.

Joining of components may be divided into two categories; (1) technologies utilizing dissimilar materials, and (2) technologies using one single material.

Technologies utilizing dissimilar materials for joining typically require inter-diffusion between the material components. Interdiffusion is used in many joining technologies including; soldering, brazing, welding, and solid liquid inter-diffusion (SLID) bonding and transient liquid phase (TLP) bonding.

Technologies using one single material for joining typically require demanding process parameters such as high temperature, high pressure, high vacuum, and high quality bond surfaces. Thus, bonding technologies using one single material are often not suited for electronic devices, because MEMS may easily be incompatible with high pressures, semiconducting materials may not comply with high temperature or larger components strive to meet the surface finish requirement. In addition, high vacuum levels and sample surface preparation add significant cost to the packaging process.

BACKGROUND—PRIOR ART

Soldering is the most common joining technology for electronics. Its main component is a filler material. It is called the solder, which is typically a bi-metal system with three phases [1]. The solder composition is usually near a eutectic point to reduce the process temperature. The solder is placed between two surfaces to be joined. The solder is heated until it melts and wets both bond surfaces. By sequential cooling the solder solidifies and creates a solid joint. Off-eutectic soldering is sometimes used for alloy compositions with a small offset from the eutectic composition. A solder process is characterized by that it melts at the same basic temperature (typically at the eutectic temperature) when it is exposed to a reflow process. Some soldering material systems create intermetallic compounds (IMC).

Brazing is similar in its characteristics as soldering, but it is carried out at an elevated process temperature, typically above 400-450° C.

Welding is another very common joining technology. There are many different forms of welding, such as resistance welding, arc welding, gas welding and laser welding. They all have in common that the bond interface is heated above the melting point of at least one of the components. The surfaces are then pressed together and upon cooling the melt solidifies and create a solid joint [1]. Welding is typically characterized by its high process temperature and near monometallic joints.

Contact melting, or diffusion bonding, is another similar technology to thermo-compression bonding and welding. It comprises two components of different material compositions that are pressed together. One component is typically a bi-metal in the form of a solid solution [1]. Solid interdiffusion then creates a bond between the two adjoined surfaces, comprising a solid solution. This process usually takes long time and is performed at high temperatures.

Thermo-compression and ultra-sonic bonding press two components of similar composition together while thermal or thermal and ultrasonic energy is transferred into the bond surfaces. This accelerates the interdiffusion process between the bond surfaces creating a solid joint at a temperature significantly below the melting points of the used materials. In principle it is similar to regular welding were the required energy to initiate bonding is supplied by a combination of heat, pressure and vibrations instead of solely by heat.

Sintering is another approach were small metal particles are placed at bond surfaces of the same or similar material. Applied pressure and heat drives a solid state diffusion process which forms a solid joint. The technology is categorized by forming mono-metallic joints of uniform, but porous, geometry at high pressure and relatively low temperature, e.g. compared to welding.

Solid liquid inter-diffusion (SLID) and transient liquid phase (TLP) is a more refined technology to create metallic joints [2]. A bi-metal system of a first and second metal is used were the first and second metal have different melting points. The bond is obtained by forming a sandwiched structure of at least one layer of the first metal made to contact at least one layer of the second metal and heating the sandwiched structure until the low melting point metal melts to the liquid state. Then the temperature is stabilised such that the other metal remains in the solid phase. The liquid metal wets the bond surfaces in the sandwiched structure and enables relatively rapid interdiffusion between the two metal phases. The interdiffusion causes a shift in the relative concentration of the solute and solvent in the material system. Eventually, this transforms the liquid phase into a solid phase, i.e. a solidification process or a phase shift, with a new homogeneous material composition. Then the joint is cooled down. Typically, the new phase may now be heated beyond the original melting point of the bond materials, and used for applications were the increased high temperature compatibility is desired. To form stable phases, SLID-bonds aim to reach specific phases, e.g. stoichiometric phases, or intermetallic compounds (IMC), in complex bi-metal systems where the solidus is not constant with temperature (at constant pressure). IMCs are often brittle and unreliable, and thusly often avoided in traditional joining applications. However, some material systems have stable material phases with a much higher melting point than the original low melting point material. Thus, the final material composition may be used for high reliability or high temperature applications. Several SLID systems have been evaluated including; Au—In, Au—Sn, Ag—In, Ag—Sn, Cu—Sn and Ni—Sn.

Document US 2013/0152990 discloses use of the SLID-technology for bonding electrodes to thermoelectric conversion materials. The document mentions $Bi_2Te_3$, GeTe, PbTe, $CoSb_3$, and $Zn_4Sb_3$ as examples of thermoelectric conversion materials, and the thermoelectric conversion material is first coated with a 1 to 5 µm thick barrier layer of Ni or other suited material, then with a 2-10 µm thick Ag, Ni or Cu layer, and finally with 1-10 µm thick Sn layer. The electrode is on one side first coated with a 2-10 µm thick Ag, Ni or Cu layer, and then with 1-10 µm thick Sn layer. The coated thermoelectric conversion material and the electrode are then laid with their Sn layers side by side and pressed together under a gentle heating until the Sn layers melt and react with the Ag, Ni or Cu to form solid intermetallic compounds bonding the electrode to the thermoelectric conversion material.

Document U.S. Pat. No. 3,025,439 discloses a method for mounting a silicon semiconductor device onto a header that comprises the steps of coating a portion of the silicon semiconductor device and header with gold, stacking the gold coatings through the intermediary of a preform consisting of 12% germanium and 88% gold and, thereafter, raising the temperature of the resultant stack to effect alloying of the gold. The resulting product is illustrated in FIG. 2 of U.S. Pat. No. 3,025,439, and is described in the document to be a complete merger and loss of identity of the gold coatings and the preform. They have been transformed into one substantially continuous gold connection or contact formed between the header and the silicon semiconductor.

From U.S. Pat. No. 3,200,490 it is known a method of making connection to a body of silicon comprising coating a surface of the body with germanium, coating a surface of the connecting part with a metal capable of forming a eutectic solution with germanium in which silicon is soluble, placing the coated surfaces in contact and heating above the eutectic temperature.

Document U.S. Pat. No. 5,038,996 discloses a method for bonding two metallic surfaces comprising coating each of the metallic surfaces with a layer of a first material and a layer of a second and different material contacting the layer of the first material. The first material and second material are chosen so that a eutectic liquid layer will form at the interface between them. The layers of the second material on each of the metallic surfaces are abutted together and then the layers are heated above the eutectic temperatures to form a localized liquid, which upon solidification results in an interconnection between the surfaces.

Document U.S. Pat. No. 7,628,309 discloses a method for bonding two components together including the steps of providing a first component, providing a second component, and locating a first eutectic bonding material between the first and second component. The first eutectic bonding material includes at least one of germanium, tin, or silicon. The method further includes the step of locating a second eutectic bonding material between the first and second component and adjacent to the first eutectic bonding material. The second eutectic bonding material includes gold. The method further includes the step of heating the first and second eutectic bonding materials to a temperature above a eutectic temperature of an alloy of the first and second eutectic bonding materials to allow a hypoeutectic alloy to form out of the first and second eutectic bonding materials. The method includes the further step of cooling the hypoeutectic alloy to form a solid solution alloy bonding the first and second components together.

Document U.S. Pat. No. 5,623,127 discloses a solder clad printed circuit board (100) consisting of an electrically insulating substrate that has copper circuit traces (105), portions of which are solderable. A substantially planar layer (120) of a soldering composition is fused to the solderable traces, to form a solder pad that is not domed. The layer is composed of a mass of off-eutectic solder particles (115) that are fused together to form an agglomeration (120) having a porous structure. The solder particles are fused together by heating the off-eutectic solder to a temperature that is between the solidus temperature and the liquidus temperature of the solder. The solder is then cooled below the solidus temperature to solidify it.

Document U.S. Pat. No. 6,854,636 discloses an electronic package having a solder inter-connect liquidus temperature hierarchy to limit the extent of the melting of the C4 solder interconnect during subsequent second level join/assembly and rework operations. The solder hierarchy employs the use of off-eutectic solder alloys of Sn/Ag and Sn/Cu with a higher liquidus temperature for the C4 first level solder interconnections, and a lower liquidus temperature alloy for the second level interconnections. When the second level chip carrier to PCB join/assembly operations occur, the chip to chip carrier C4 interconnections do not melt completely. They continue to have a certain fraction of solids, and a lower fraction of liquids, than a fully molten alloy. This provides reduced expansion of the solder join and consequently lower stresses on the C4 interconnect.

BRIEF SUMMARY OF THE INVENTION

The main objective of the invention is to provide a method for forming a mechanically resilient and flexible two-phase mixture joint comprising a single-phase solid solution structure for bonding together solid components and joints made by the method.

The objective may be obtained by the features given in the appended patent claims.

The present invention may be considered as a reduction to practice of the realization that the "mushy zone" which may be formed in certain miscible or partly miscible (eutectic) binary systems of component A and component B at temperatures in-between the system's solidus and liquidus temperatures, may be utilised to form a coherent single solid-solution phase extending across a bonding layer. The single solid-solution phase may be utilised to form a mechanically resilient and flexible bond between two solid components at temperatures at a certain range between the solidus temperature but below the liquidus temperature of the binary system.

Thus, in a first aspect the present invention relates to a method for forming a joint between a bonding surface of a first solid object and a bonding surface of a second solid object, wherein the method comprises:

A) providing a binary system of components A and B, where the binary system is either:
 i) a completely miscible binary system having an overall composition $C_0$ within the range: $C_0=C_{liq}-f_\alpha(C_{liq}-C_\alpha)$
 where;
 $C_{liq}$ is the composition of a liquid phase coexisting with a single-phased solid solution when the binary system is at a temperature $T_1=(T_{liq,A}+T_{liq,B})/2$, $C_\alpha$ is the composition of the a single-phased solid solution coexisting with the liquid phase when the binary system is at a temperature $T_1$, $T_{liq,A}$ is the melting temperature of 100% pure component A, $T_{liq,B}$ is the melting temperature of 100% pure component B, and $f_\alpha$ is the fraction of single-phased solid solution present in the miscible binary system at temperature $T_1$, and where $f_\alpha$ is the range of [0.26, 1), or ii) a partly miscible binary system having only three phase fields when being in its solid state region and which has either a hypoeutectic or a hypereutectic composition, wherein if the composition of the partly miscible binary system is hypoeutectic, the partly miscible binary system has an overall composition $C_0$ in the range: $C_0=C_{liq}-f_\alpha(C_{liq}-C_\alpha)$ where;

$C_{liq}$ is the composition of a liquid phase coexisting with an α-phase when the binary system is at a temperature $T_1=(T_{liq,A}+T_{eut})/2$, $C_\alpha$ is the composition of the α-phase coexisting with the liquid phase when the binary system is at a temperature $T_1=(T_{liq,A}+T_{eut})/2$, $T_{liq,A}$ is the melting temperature of 100% pure component A, $T_{eut}$ is the eutectic temperature of the eutectic binary system, and $f_\alpha$ is in the range of [0.26, 1), or wherein, if the composition of the partly miscible binary system is hypereutectic, the partly miscible binary system has an overall composition $C_0$ in the range: $C_0=f_\beta(C_\beta-C_{liq})+C_{liq}$ where;

$C_{liq}$ is the composition of a liquid phase coexisting with an β-phase when the binary system is at a temperature $T_1=(T_{liq,B}+T_{eut})/2$, $C_\beta$ is the composition of the β-phase coexisting with the liquid phase when the binary system is at a temperature $T_1=(T_{liq,B}+T_{eut})/2$, $T_{liq,B}$ is the melting temperature of 100% pure component B, $T_{eut}$ is the eutectic temperature of the eutectic binary system, and $f_\alpha$ is in the range of [0.26, 1), B) forming a sandwiched structure comprising the first solid object, the binary system and the second solid object by facing the bonding surface of the second solid object towards the bonding surface of the first solid object, where the binary system is interposed between and made to contact the bonding surfaces of both the first and second objects, and C) forming the joint bonding the first and second objects by heat treating the sandwiched structure at a temperature, upwardly limited to temperature $T_1$, which causes the miscible or partly miscible binary system of components A and B to form a porous, coherent and continuous structure of a single-phased solid solution of the A- and B-components being interposed between the bonding surfaces of both the first and second objects, and a second phase of the A- and B-components dispersed in the porous, coherent and continuous structure of a single-phased solid solution of the A- and B-components.

In a second aspect, the present invention relates to a joint between a bonding surface of a first solid object and a bonding surface of a second solid object, comprising a bonding layer made of a binary system of components A and B, wherein the binary system is either:

i) a miscible binary system, having an overall composition $C_0$ within the range: $C_0=C_{liq}-f_\alpha(C_{liq}-C_\alpha)$ where;

$C_{liq}$ is the composition of a liquid phase coexisting with a single-phased solid solution when the binary system is at a temperature $T_1=(T_{liq,A}+T_{liq,B})/2$, $C_\alpha$ is the composition of the single-phased solid solution coexisting with the liquid phase when the binary system is at a temperature $T_1$, $T_{liq,A}$ is the liquidus temperature of 100% pure component A, $T_{liq,B}$ is the liquidus temperature of 100% pure component B, and $f_\alpha$ is in the range of [0.26, 1), or ii) a partly miscible binary system of either hypoeutectic or hypereutectic composition having only three phase fields in its solid state region, and if the composition of the partly miscible binary system is hypoeutectic, it has an overall composition $C_0$ in the range: $C_0=C_{liq}-f_\alpha(C_{liq}-C_\alpha)$ where;

$C_{liq}$ is the composition of a liquid phase coexisting with an α-phase when the binary system is at a temperature $T_1=(T_{liq,A}+T_{eut})/2$, $C_\alpha$ is the composition of the α-phase coexisting with the liquid phase when the binary system is at a temperature $T_1=(T_{liq,A}+T_{eut})/2$, $T_{liq,A}$ is the melting temperature of 100% pure component A, $T_{eut}$ is the eutectic temperature of the eutectic binary system, and $f_\alpha$ is in the range of [0.26, 1), or if the composition of the partly miscible binary system is hypereutectic, it has an overall composition $C_0$ in the range: $C_0=f_\beta(C_\beta-C_{liq})+C_{liq}$ where;

$C_{liq}$ is the composition of a liquid phase coexisting with an β-phase when the binary system is at a temperature $T_1=(T_{liq,B}+T_{eut})/2$, $C_\beta$ is the composition of the β-phase coexisting with the liquid phase when the binary system is at a temperature $T_1=(T_{liq,B}+T_{eut})/2$, $T_{liq,B}$ is the melting temperature of 100% pure component B, $T_{eut}$ is the eutectic temperature of the eutectic binary system, and $f_\beta$ is in the range of [0.26, 1), and further wherein the binary system of miscible or partly miscible components A and B comprises a porous, coherent and continuous structure of a single-phased solid solution of the A- and B-components being interposed between the bonding surfaces of both the first and second objects, and a second phase of the A- and B-components dispersed in the porous, coherent and continuous structure of a single-phased solid solution of the A- and B-components.

The notation for intervals as used herein follows the international standard ISO 80000-2, where the brackets "[" and "]" indicate a closed interval border, and the parentheses "(" and ")" indicate an open interval border. For example, [a, b] is the closed interval containing every real number from a included to b included: [a, b]={x ∈ ℝ |a≤x≤b}, while (a, b] is the left half-open interval from a excluded to b included: (a,b]={x ∈ ℝ |a<x≤b}.

The term "squeezing the first and second bonding surface towards each other" as used herein, is to be interpreted in the context of forming a bonding layer bonding together the bonding surface of the first solid component and the bonding surface of the second component. Thus, the term "squeezing" implies use of an appropriate pressing force to hold the sandwiched structure together during the heat treatment for transforming the binary system into the two-phase mixture comprising the coherent and continuous single-phase solid-solution extending across the bonding layer The term "overall composition" as used herein refers to the composition of the binary system as such, i.e. the total amount of component A and/or component B present in the miscible or partly miscible (eutectic) binary system—to make a distinction over the composition of the phases present in the binary system. The overall composition is given herein in weight % of component A (or B) unless specified otherwise. As an example, if the overall composition is 20 weight % A, the amount of component B in the binary system becomes 80 weight % since in a binary system the total weight % of A and B must sum up to 100%. However, this should not be interpreted in the absolute mathematical sense of the term, in the practical life there will inevitably be present minor amounts of impurities such that the sum of the weight % A and weight % B in the binary system may deviate slightly from 100.

BRIEF DESCRIPTION OF THE DRAWINGS

The invention will be described in detail with reference to the drawings, wherein:

FIG. 7A is a SEM-photograph of the resulting joint in a sample exposed to a short heat treatment of a few minutes at a temperature above the eutectic temperature.

FIG. 7B is a SEM-photograph of a similar joint in a sample having been treated in the same manner as the sample of FIG. 7a) and in addition annealed at 300° C. for 4 hours.

DETAILED DESCRIPTION OF THE INVENTION

Figure 1:
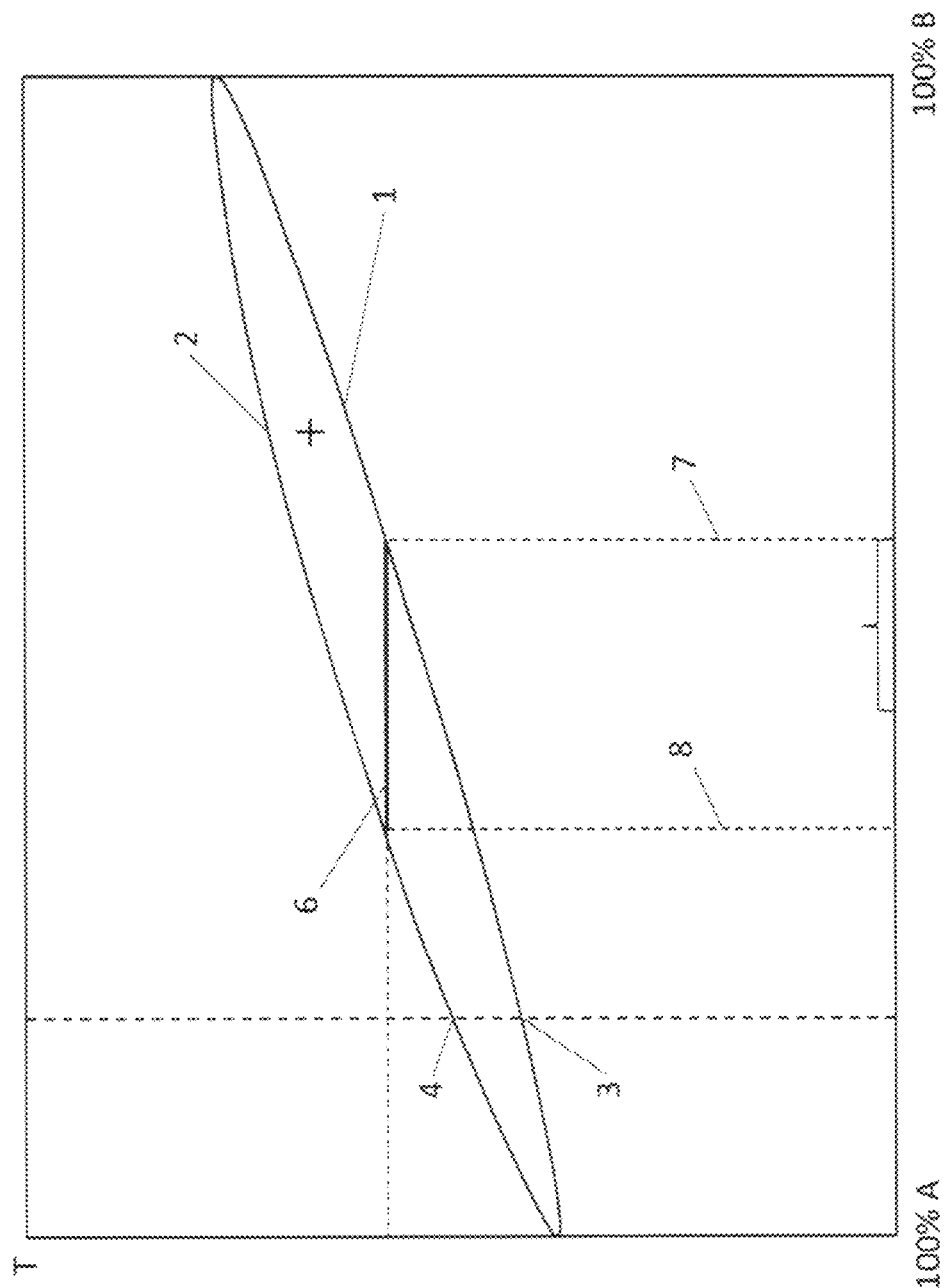
FIG. 1 is a typical phase diagram of a completely miscible binary system.

A typical phase diagram showing the thermodynamically stable phase fields of a miscible binary system of component A and component B as a function of composition and temperature is shown in FIG. 1. The abscissa or horizontal axis of the phase diagram represents the (overall) composition of the binary miscible system from 100% pure A to the far left of the diagram to 100% pure B at the far right of the diagram. The ordinate or vertical axis represents the temperature, with increasing temperature towards the upper part of the diagram.

The term "miscible binary system of component A and component B" as used herein, means any composition of two components A and B which are completely miscible in each other, i.e. where the components are fully solvable in the same crystal lattices by either interstitial or substitutional dissolution at any composition ranging from 100% pure A to 100% pure B. The component A and the component B may be any chemical or physical mixture having an overall composition $C_0$ and where the A- and B-components are able to react by interdiffusion to form a porous, coherent and continuous structure of a single-phased solid solution of the A- and B-components. The binary system may be provided in any form suited for forming by interdiffusion the bonding layer comprising the porous, coherent and continuous structure of a single-phased solid solution interposed between and in contact with the bonding surfaces of the objects to be bonded. This includes, but is not limited to, a mixture of particulate component A and component B, a sandwiched structure of one or more sheets of component A interposed with one or more sheets of components B, one or more sheets of a chemical mixture (e.g. an alloy) of component A and B interposed between two or more sheets of either component A or B, etc.

The terms "miscible" and "partly miscible" as used herein, relate to the solid phases of the binary system being applied. In a completely miscible binary system, the components A and B are fully solvable in the same crystal lattices by either interstitial or substitutional dissolution at any composition ranging from 100% pure A to 100% pure B. In a partly miscible binary system having three phase fields in its solid state region, there will be three different regions of solubility defining three different crystal lattices having separate composition ranges of A and B. One phase field consisting of only an α-phase consisting predominantly of the A-component and relatively little of the B-component, one β-phase consisting predominantly of the B-component and relatively little of the A-component, and one phase field being a mixture of the α-phase and the β-phase.

The terms "miscible" and "partly miscible" as used herein, relate to the solid phases of the binary system being applied. In a completely miscible binary system, the components A and B are fully solvable in the same crystal lattices by either interstitial or substitutional dissolution at any composition ranging from 100% pure A to 100% pure B. In a partly miscible binary system having three phase fields in its solid state region, there will be three different regions of solubility defining three different crystal lattices having separate composition ranges of A and B. One phase field consisting of only an α-phase consisting predominantly of the A-component and relatively little of the B-component, one β-phase consisting predominantly of the B-component and relatively little of the A-component, and one phase field being a mixture of the α-phase and the β-phase.

The single-phased solid solution of the A- and B-components is often denoted the α-phase when only one such solid-solution phase exists in the binary system, as e.g. shown in the phase diagram of FIG. 1. If there are two distinct solid-solution phases present in the binary system, they are usually distinguished by denoting then as the α-phase and the β-phase. Thus the term "component A" or "component B" as used herein includes any chemical compound or chemical element able to form, when having overall composition $C_0$, the miscible or partly miscible binary system having the two-phase field containing a single-phase solid solution of the A- and B-components and another phase of the A- and B-components which becomes liquid at temperatures above the solidus temperature.

The term "coherent" as used herein is the adjective form of the term "cohering", and is to be interpreted such that the porous solid solution of components A and B, of either an α-phase or a β-phase, formed by the heat treatment of the miscible or partly miscible binary system according to the invention, is a solid body of either the α-phase or the β-phase in contact with and bonding together the substrates that are to be bonded. The single-phase body of either α-phase or β-phase will remain in the solid state and functioning as the load carrying structure of the bond according to the invention when heated to a temperature between solidus temperature and $T_1$.

The coherent single solid-solution phase extending across the bonding layer according to the invention is obtained by a redistribution of the A- and B-components in the mixture of overall composition $C_0$ caused by interdiffusion. The interdiffusion process may be enhanced by a heat treatment. The heat treatment may involve temperatures ranging from room temperature up to above the solidus temperature of the binary system. That is, depending on the actual binary system of component A and component B being utilised, the interdiffusion process forming the coherent and continuous load carrying structure of the single-phased solid solution (of either the α-phase or the β-phase) from the mixture of the A- and B-components may take place entirely in the solid state or in the mixed zone of part liquid and part solid state. For many binary systems, a liquid-solid interdiffusion process is several orders of magnitude more rapid than a pure solid interdiffusion process such that the heat treatment may advantageously be performed at a temperature above the solidus temperature of at least one of the components in the mixture the A- and B-components. However, the temperature during the heat treatment should not be raised too close to the liquidus to avoid having too much of the binary system in the liquid state. Thus, the heat treatment, i.e. the heating of the binary system should be upwardly limited to temperature $T_1$ to avoid being too close to the liquidus temperature. Some binary systems have an acceptable rapid interdiffusion allowing forming the coherent and continuous load carrying structure at temperatures down to room temperature, but most systems requires a considerably higher heat treatment temperatures to obtain acceptable heat treatment periods. Thus in practice, one of the following intervals; $[0.5 \cdot Ts, T_1]$, $[0.7 \cdot Ts, T_1]$, $[0.75 \cdot Ts, T_1]$, $[0.8 \cdot Ts, T_1]$, $[0.85 \cdot Ts, T_1]$, $[0.9 \cdot Ts, T_1]$ or $[0.95 \cdot Ts, T_1]$, where Ts is the solidus temperature for the binary system at composition $C_0$, is a suited range for activating the interdiffusion process forming the coherent and continuous load carrying structure forming heat treatment according to the invention. Alternatively, the heat treatment may advantageously be an initial heating into the mushy region, i.e. to a temperature in the range from $T_{sol}$ to $T_1$ where $T_{sol}$ is the solidus temperature of the binary system at overall composition $C_0$, for a period of a few minutes such as e.g. 4-5 minutes, followed by a cooling of the binary system to a temperature in the range from $0.8 \cdot T_{sol}$ to $T_{sol}$ and maintain this temperature for a few hours such as e.g. 2 to 10 hours, preferably 3 to 6 hours, more preferably 3 to 4 hours.

The interdiffusion process forming the porous, coherent and continuous structure of a single-phased solid solution of the A- and B-components according to the invention is a kinetic controlled reaction which require some amount of time to be completed and which must be heated to at least its activation temperature to be initiated. The heat treating in the method according to the first aspect of the invention encompasses thus heating the binary system to any temperature activating this interdiffusion process and maintaining this temperature as long as it takes to perform the reaction. This period of time may vary from seconds to several hours or more, depending on which binary system and heat treating temperature being applied. The determination of the length of the heat treating period and the applied temperature to form the bonding structure in a specific binary system may be obtained by simple trial end error experiments.

A characteristic of fully miscible binary systems is that the system forms only one solid phase being a single-phase solid solution of components A and B at temperatures below the systems solidus line at overall compositions ranging from (but not including) pure A up to (but not including) pure B. The single-phase solid solution of components A and B formed in fully miscible binary systems is often denoted, and is shown in FIG. 1, as the α-phase. In partly miscible binary systems, there is a limit to how much B-components may be dissolved into the crystal lattice of the single-phase solid solution. Thus, partly miscible binary systems usually form two single-phase solid solutions, one being a single-phase solid solution of B-components dissolved into a crystal lattice of A-components which usually is denoted the α-phase, the other being single-phase solid solution of A-components dissolved into a crystal lattice of B-components which usually is denoted the β-phase. Thus the term "single solid solution of components A and B" as used herein, means any mixture of components A and B where the components A and B share a common crystal lattice and exist as a single homogeneous crystalline phase in the solid state.

When the temperature increases, the solid solution (α-phase or (β-phase) will at a certain temperature begin to melt. This temperature is known as the solidus temperature and is often a function of the (overall) composition of the solid solution, such that the solidus temperature for the entire composition range forms a line denoted the solidus line, which in FIG. 1 is the line marked with reference number 1.

In the phase field above the solidus line the miscible binary system will exist as a two-phase mixture of the solid α-phase and a liquid phase, the higher the temperature, the larger fraction of the liquid fraction becomes until all of the α-phase is melted. The temperature at which all of the solid α-phase is melted is known as the liquidus temperature. The line indicating the liquidus temperature for the entire composition range is known as the liquidus line, which on FIG. 1 is marked with reference number 2. In the phase field above the liquidus line, marked with "L" in FIG. 1, the binary miscible system of component A and component B is completely liquid.

Phases formed by a single component have a single well defined temperature being both the liquidus and the solidus temperature. This temperature is often denoted the melting temperature or melting point. As used herein, the term "melting temperature" means the liquidus temperature of a pure component of either A or B. Thus, at the overall composition of 100% pure A, the binary system has a single temperature being both the liquidus and the solidus temperature, herein denoted; $T_{liq,A}$. Likewise, at 100% pure B, there is also a well defined temperature, $T_{liq,B}$, being both the liquidus and solidus temperature.

At overall compositions in-between 100% pure A and 100% pure B, the liquidus and the solidus temperatures for miscible binary system are usually separated from each other such that at these overall compositions, the binary systems melts over a temperature range. An example of such "melting gap" is indicated in FIG. 1 by the stapled vertical line intercepting the abscissa at the point marked "$C_1$". At the temperature corresponding to the interception point (marked with reference number 3 in FIG. 1) between this vertical stapled line and the solidus line 1, the binary system will transform from being in only a single α-phase to a "mushy state" of both the α-phase and a liquid phase. When the temperature increases further above the solidus temperature, more and more of the α-phase melts and increases the fraction of the liquid phase until all α-phase is melted and the binary system is completely in the liquid state. This temperature corresponds to the interception point (marked with reference number 4 in FIG. 1) between this vertical stapled line and the liquidus line 2. The phase field lying between the solidus and the liquidus line over the entire composition range, marked with "L+α" in FIG. 1, is sometimes denoted the "mushy zone" due to be a mixture of the solid α-phase and the liquid phase.

The present invention is based on the realisation that miscible and partly miscible (eutectic) binary systems may form a bonding layer or joint having a porous, i.e. a coherent continuous structure which would appear as a structural material at temperatures somewhat above the solidus temperature. At these elevated temperatures, the pores will be filled with a melt of both A- and B-components, while the excess solvent still forms a continuous and coherent structure providing mechanical rigidity, and thus may be utilized as a structural joint.

Experiments made by the inventor and theoretical considerations indicate that this porous or coherent continuous structure of the α-phase enables the binary system being utilized as a structural joint, is obtained when the overall composition of the binary system is in a range corresponding to a certain fraction of the isothermal line (also denoted as the tie line in the literature) running from the intersection point of the solidus line to the intersection point of the liquidus line at a temperature somewhere around the middle of the temperature range where the binary system exists in the α+L phase field. A miscible binary system having an overall composition in this "bonding effective" range allows being used to form a bonding layer which maintains the required mechanical integrity at temperatures to at least the mean temperature between the solidus and liquidus temperature.

The "bonding effective" composition range of the miscible binary system may be determined in many ways. In the present invention, it is applied the binary phase diagram of the actual miscible binary system and the lever rule to define a clear and unambiguous composition range of the miscible binary system according to the first and second aspect of the invention. The determination method is anchored to two material specific constants, the melting points for 100% pure A and 100% pure B, $T_{liq,A}$ and $T_{liq,B}$, respectively. Then by pure choice, the isotherm (tie line) at a temperature $T_1$ equal to the middle value of $T_{liq,A}$ and $T_{liq,B}$ is applied to determine the composition, $C_\alpha$, of the α-phase at temperature $T_1$, and the composition, $C_{liq}$, of the liquid phase at temperature $T_1$. The intersection point between the solidus line and the tie line for temperature $T_1$ indicate the composition, $C_\alpha$, of the α-phase (at temperature $T_1$), and the intersection point between the tie line and the liquidus line indicate the composition, $C_{liq}$, of the liquid phase (at temperature $T_1$). The tie line is shown in FIG. 1 and marked by reference number 6. The composition $C_\alpha$ is indicated by the stapled line 7, and the composition $C_{liq}$ is indicated by the stapled line 8. The lever rule gives that the fraction of α-phase, $f_\alpha$, being present in the mushy zone for a binary system in thermodynamic equilibrium at temperature $T_1$ with composition $C_0$, is given by the ratio of the portion of the tie line from the overall composition, $C_0$, to the liquid composition, $C_{liq}$, over the length of the tie line from $C_\alpha$ to $C_{liq}$, and the fraction of liquid phase, $f_{liq}$, is given by the ratio of the portion of the tie line from the $C_0$ composition to the $C_\alpha$ composition over length of the tie line from $C_\alpha$ to $C_{liq}$:

$$f_\alpha = \frac{(C_{liq} - C_0)}{(C_{liq} - C_\alpha)} \tag{1}$$

and $$f_{liq} = \frac{(C_0 - C_\alpha)}{(C_{liq} - C_\alpha)}$$

The coherent and continuous single solid solution phase extending across the boundary layer may be formed over a range of fractions of α-phase content in the mushy zone. The present invention according to the first and second aspect utilises thus Eqn. (1) (i.e. the lever rule) and the phase diagram for the miscible binary system to define unambiguous material specific constants, which together with a specified range for the fraction of α-phase, provides a clear and concise determination of the overall composition range of the miscible binary system according to the present invention. That is, the overall composition, $C_0$, of the miscible binary system of component A and B should be in the range of, as defined by the given range of $f_\alpha$ and Eqn. (1):

$$C_0 = C_{liq} - f_\alpha(C_{liq} - C_\alpha) \tag{2}$$

when the composition of the α-phase, $C_\alpha$, and the liquid phase, $C_{liq}$ are determined by the intersection points between the tie line at temperature $T_1 = (T_{liq,A} + T_{liq,B})/2$ and the solidus and the liquidus line, and the fraction $f_\alpha$ is in the range of [0.26, 1). This range for $C_0$ is indicated in FIG. 1 by the curly bracket marked with "$C_0$".

The upper and lower limit of the fraction $f_\alpha$ is determined from the following: It is evident that the mechanical rigidity of the bonding layer (at temperatures above the solidus temperature) increases with increasing fraction of the α-phase. Thus the upper limit for the range of α-phase is as close to the interception point between the tie line at $T_1$ and the solidus line as possible, i.e. up to but not including, a fraction, $f_\alpha$, equal to one. The determination of the lower limit of the fraction is based on an experimental observation that the liquid phases in the bonding layer according to the invention often tend to be dispersed as a phases with spherical, ellipsoidal or similar shapes in the matrix of the porous or coherent continuous structure of the α-phase. The fraction of free space or porosity in a material composed of spherical particles of identical size (independent of grain size) packed in a rhombohedral pattern is 0.26 [3]. This fractions represents the minimum space needed to be occupied by the α-phase to ensure that the fraction of liquid phase is present as separate spheres dispersed in the α-phase, i.e. which makes the α-phase be present as a porous and coherent continuous structure. Thus, the maximum range for the fraction $f_\alpha$ according to the first and second aspect of the invention is in the range of: [0.26, 1). Alternatively, the fraction $f_\alpha$ is in one of the following ranges: [0.30, 1); [0.36, 1); [0.42, 1); [0.48, 1); [0.54, 1); [0.60, 1); [0.66, 1); [0.72, 1); [0.78, 1); [0.84, 1); [0.90, 1); [0.95, 1); [0.26, 0.99]; [0.30, 0.98]; [0.36, 0.97]; [0.42, 0.96]; [0.48, 0.95]; [0.52, 0.94]; [0.58, 0.93]; [0.64, 0.92]; [0.72, 0.91]; [0.95, 0.99]; or [0.80, 0.90].

Furthermore, the porous and coherent continuous single solid-solution structure may be formed in any system having a mixed phase field with a solid and liquid phase, i.e. a "mushy zone". Another binary system well suited for the present invention is partly miscible binary systems where the components A and B are not fully miscible across the entire range from 100% pure A to 100% pure B, but will separate into a two-phase field in the solid region consisting of two different solid-solution phases ($\alpha$ and $\beta$) when the amount of A and B in the overall composition becomes higher than the solubility of B in the crystal lattice of A and the solubility of A in the crystal lattice of B, respectively. If the two-phase field region becomes sufficiently large to touch the solidus line, the system is said to be a eutectic binary system. The term "eutectic binary system of component A and component B" as used herein, means any composition of two components A and B which may form one or two solid phases, $\alpha$ and/or $\beta$, depending on the overall composition of the composition and its temperature. The $\alpha$-phase is a solid solution of component A having an amount of B atoms dissolved into its parent lattice (of A-atoms), and conversely, the $\beta$-phase is a solid solution of component B having an amount of A atoms dissolved into its parent lattice (of B-atoms).

Figure 2:
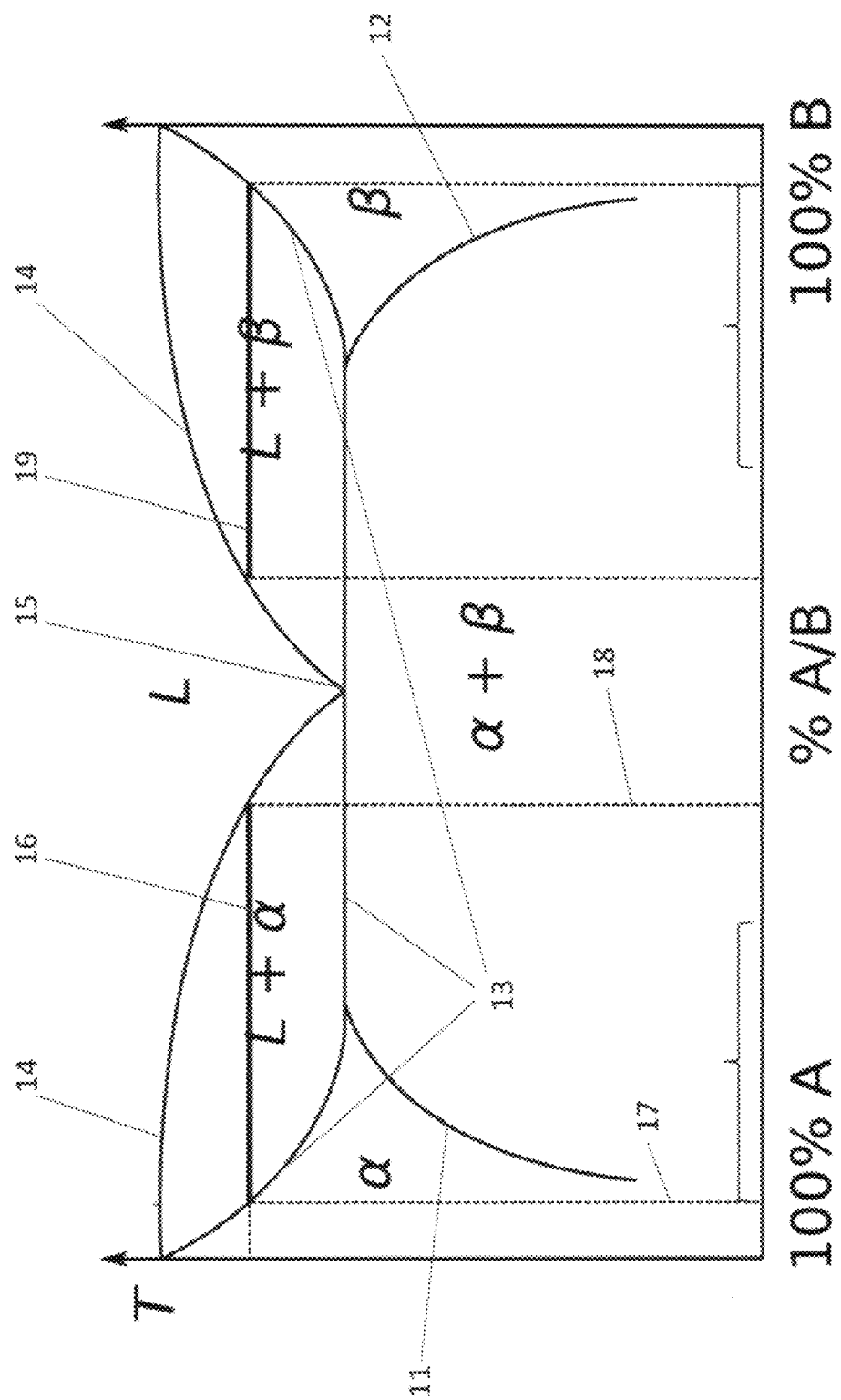
FIG. 2 is a typical phase diagram of a eutectic binary system.

An example of a typical phase diagram of a eutectic binary system of component A and component B is shown in FIG. 2. The solid region of eutectic binary systems typically contains three phase fields. To the left, at high contents of A, there is a phase field consisting of a solid solution of B atoms dissolved in the crystal lattice of A, denoted as the $\alpha$-phase on FIG. 2. At the far right, at high contents of B, the phase field is a solid solution of A atoms dissolved in the crystal lattice of B, denoted as the $\beta$-phase on FIG. 2. The phase field between these two is a solid mixture, more precisely a two-phase field of both the $\alpha$-phase and the $\beta$-phase. The line marked with reference number 11 in FIG. 2 is often termed the solvus line and represents the solubility limit of B in A, and correspondingly, the line marked with reference number 12 in FIG. 2 is the solvus line representing the solubility limit of A in B. The solidus line is marked with reference number 13. The solubility of A in B, or conversely B in A, may for some eutectic binary alloys be so low that for all practical means it may be considered to be zero solubility. In such cases, the solvus line 11 and/or 12 may fall onto and be impossible to distinguish from the ordinate axis at 100% A and/or 100% B in the phase diagram.

The liquidus line is marked with reference number 14 in FIG. 2. As seen on the figure, there is a local minimum in the liquidus line where it intersects with the solidus line. This is the eutectic point and is marked with reference number 15 in FIG. 2. A characteristic of eutectic binary systems is that they may form at least two "mushy zones", one at "A-rich" compositions to the left of the eutectic point and one at "B-rich" compositions to the right of the eutectic point. Overall compositions falling within the region of the phase diagram to the left of the eutectic point are often termed hypoeutectic compositions. Correspondingly, overall compositions falling within the region of the phase diagram to the right of the eutectic point are often termed hypereutectic compositions.

At the eutectic point, the overall composition of the eutectic binary system is such that when reaching the liquidus temperature, both the $\alpha$-phase and the $\beta$-phase solidify simultaneously. Thus, at this specific composition, usually denoted the eutectic composition, the eutectic binary system has a single well defined melting (and solidification) point such that the liquidus temperature is the same as the solidus temperature, i.e. it will be fully liquid at (moderate) temperatures above the eutectic temperature and fully solid at temperatures below the eutectic temperature. This is an invariant point where three conjugate phases coexist. This is the reason why in conventional bonding by soldering, it is preferred to apply solder pastes having, or being close, to the eutectic composition, often referred to as off-eutectic soldering.

The simplest eutectic binary system has two "mushy regions" of either the $\alpha$-phase and a liquid phase (for hypoeutectic compositions) or the $\beta$-phase and a liquid phase (for hypereutectic compositions). Both of these "mushy regions" of a eutectic binary system may be applied to form the porous coherent and continuous bonding structure of a single solid-solution phase according to the invention. For eutectic binary system there is however advantageous to apply other "anchoring points" in the phase diagram to determine the overall composition, $C_0$, of the eutectic binary system. When utilising a eutectic binary system for forming the bond according to the present invention, the "anchoring points" for the determination of the overall composition range may advantageously be the melting point for 100% pure A, $T_{liq,A}$ and the eutectic temperature, $T_{eut}$, for hypoeutectic compositions, and the melting point for 100% pure B, $T_{liq,B}$ and the eutectic temperature, $T_{eut}$, for hypereutectic compositions. Otherwise the same determination procedure is applied.

Thus, in the case of applying a eutectic binary system having a hypoeutectic overall composition, the fraction of $\alpha$-phase being present at a given temperature $T_1$ may be determined by drawing a tie line at temperature $T_1$ running from the intersection point of the solidus line 13 to the intersection point of the liquidus line 14 at the hypoeutectic range of the phase diagram of the eutectic binary system. The intersection point between the solidus line and the tie line indicate the composition, $C_\alpha$, of the $\alpha$-phase (at temperature $T_1$), and the intersection point between the tie line and the liquidus line indicate the composition, $C_{liq}$, of the liquid phase (at temperature $T_1$). An example of a tie line in the hypoeutectic range is shown in FIG. 2 and marked by reference number 16. The composition $C_\alpha$ is indicated by the stapled line 17, and the composition $C_{liq}$ is indicated by the stapled line 18. The resulting overall composition range for the eutectic binary system of component A and B in the hypoeutectic range should be in the range of:

$$C_0 = C_{liq} - f_\alpha(C_{liq} - C_\alpha) \qquad (2)$$

where the composition of the $\alpha$-phase, $C_\alpha$, and the liquid phase, $C_{liq}$ are determined by the intersection points between the tie line at temperature $T_1 = (T_{liq,A} + T_{eut})/2$ and the solidus and the liquidus line, and the fraction $f_\alpha$ is in the range of [0.26, 1). This range for $C_0$ is indicated in FIG. 2 by the (left side) curly bracket marked with "$C_0$". Alternatively, the fraction $f_\alpha$ is in one of the following ranges: [0.30, 1); [0.36, 1); [0.42, 1); [0.48, 1); [0.54, 1); [0.60, 1); [0.66, 1); [0.72, 1); [0.78, 1); [0.84, 1); [0.90, 1); [0.95, 1); [0.26, 0.99];

[0.30, 0.98]; [0.36, 0.97]; [0.42, 0.96]; [0.48, 0.95]; [0.52, 0.94]; [0.58, 0.93]; [0.64, 0.92]; [0.72, 0.91]; [0.95, 0.99]; or [0.80, 0.90].

Similarly, in the case of applying a eutectic binary system having a hypereutectic overall composition, the overall composition $C_0$ may be determined by drawing a tie line 19 in the hypereutectic region of phase diagram of the eutectic binary system at temperature $T_1=(T_{liq,B}-T_{eut})/2$ to determine composition of the β-phase, $C_β$, and the composition of the liquid phase, $C_{liq}$ by the intersection points between the tie line and the solidus and the liquidus line at the hypereutectic region of phase diagram. In this case, the lever rule gives that the fraction of the β-phase, $C_β$, being present in the mushy zone for a binary system in thermodynamic equilibrium at temperature $T_1$ with composition $C_0$, is given by the ratio of the portion of the tie line from the overall composition, $C_0$, to the liquid composition, $C_{liq}$, over the length of the tie line from $C_β$ to $C_{liq}$, and the fraction of liquid phase, $f_{liq}$, is given by the ratio of the portion of the tie line from the $C_0$ composition to the $C_β$ composition over length of the tie line from $C_β$ to $C_{liq}$:

$$f_β = \frac{(C_0 - C_{liq})}{(C_β - C_{liq})} \quad (3)$$

and $$f_{liq} = \frac{(C_β - C_0)}{(C_β - C_{liq})}$$

In the case of a eutectic binary system of component A and B having a hypereutectic composition range, eqn. (3) and the lever rule gives that the overall composition, $C_0$, should be in the range of, as defined by the given range of $f_β$ and Eqn. (3):

$$C_0 = f_β(C_β - C_{liq}) + C_{liq} \quad (4)$$

when the composition of the β-phase, $C_β$, and the liquid phase, $C_{liq}$ are determined by the intersection points between the tie line at temperature $T_1=(T_{liq,B}+T_{eut})/2$ and the solidus and the liquidus line, and the fraction $f_β$ is in the range of [0.26, 1). This range for $C_0$ is indicated in FIG. 2 by the (right side) curly bracket marked with "$C_0$". Alternatively, the fraction $f_β$ is in one of the following ranges: [0.30, 1); [0.36, 1); [0.42, 1); [0.48, 1); [0.54, 1); [0.60, 1); [0.66, 1); [0.72, 1); [0.78, 1); [0.84, 1); [0.90, 1); [0.95, 1); [0.26, 0.99]; [0.30, 0.98]; [0.36, 0.97]; [0.42, 0.96]; [0.48, 0.95]; [0.52, 0.94]; [0.58, 0.93]; [0.64, 0.92]; [0.72, 0.91]; [0.95, 0.99]; or [0.80, 0.90].

A distinctive characteristic of the present invention over prior art bonding technologies is that the bonding is the choice of overall composition of the binary system. More precisely, the overall composition of the miscible or partly miscible binary system being applied to form the bonding is tuned such that will not be completely in the solid state at thermodynamic equilibrium at temperatures above the solidus temperature (and below the liquidus temperature), but be partly in the solid state and partly in the liquid state. Prior art bonding technologies, as far as the inventor knows, tunes the composition of the bonding materials such that they either become completely in the liquid state above the solidus temperature (eutectic compositions or near eutectic compositions and pure elementary compositions), or completely in the solid state (as a single-phase solid solution or intermetallic compound).

The present invention has the advantage of enabling forming the bond at a relatively low process temperature which may be less than the intended operation temperature of the bond, similar to e.g. SLID-bonding or TLP-bonding. However, the present invention has the additional advantage of partly remelting the bonding layer if the operation temperature becomes higher than the solidus temperature, as opposed to SLID-bonds or TLP-bonds which remain completely in the solid state to temperatures far above the temperature at which the bond was created in. The partly remelting of the bond layer according to the invention is believed to provide the advantage of releasing thermal stresses in the bond, possible recovery of zones with significant defect concentrations at grain boundaries, and probably also reducing the occurrence of the detrimental Kirkendall voiding effect between bond components.

Thus the joints according to the present invention are believed to be more resilient when exposed to thermal loads such as cycling and high temperature operation, especially when the thermal cycling involves temperatures above the solidus temperature. Another benefit of the joint according to the invention avoids fragile intermetallic compounds as is sometimes present in SLID-bonds and that the bonds may be formed at significantly less processing times than often encountered in TLP-bonding. The invention also enables bonds to be formed from material systems with very limited mutual solubility, such as the In—Si system. For such systems, TLP is impractical due to extreme geometrical requirements such as bond layer thicknesses, surface roughness and planarity.

The invention may apply any binary system of component A and B at an overall composition as given above for the first and second aspect of the invention enabling forming the coherent single solid-solution phase extending across a bonding layer having the ability to carry mechanical loads. Examples of suited miscible binary systems of component A and component B include, but are not limited to: Ge—Si, Mo—W, Nb—W and V—W. Examples of suited partly miscible binary systems of component A and component B include, but are not limited to: Ag—Bi, Ag—Cu, Ag—Ge, Ag—Mo, Ag—Pb, Ag—Si, Ag—Ti, Al—Be, Al—Bi, Al—Ga, Al—Ge, Al—N, Al—Sn, Au—Bi, Au—Ge, Au—Mo, Au—Sb, Au—Si, Au—W, Bi—Cu, Bi—Ge, Bi—Ni, Bi—Sn, Cr—Sn, Cu—Si, Fe—In, Ga—Ge, Ga—Si, Ga—Zn, Ge—In, Ge—Pb, Ge—Sb, Ge—Sn, Ge—Zn, In—Si, In—Zn, Pb—W, Pd—W, Sb—Si, Si—Sn, Si—Zn, Sn—Zn, or $SiO_2$—$Al_2O_3$. Of these binary systems, the following systems have shown to be especially preferred systems for forming the joint of the present invention: Al—Ge, Al—Sn, Au—Ge, Au—Si, Bi—Cu, Bi—Ge, Bi—Sn, Ga—Ge, Ge—In, In—Si, and Si—Sn.

Figure 3B:
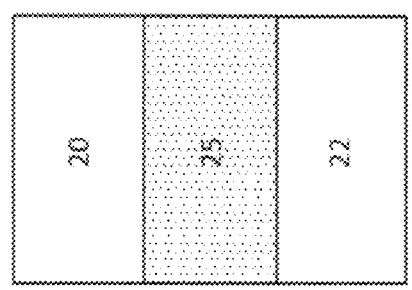
FIG. 3B is a drawing of the example embodiment shown in FIG. 3a) after a heat treatment has obtained the joint according to the invention.
Figure 3A:
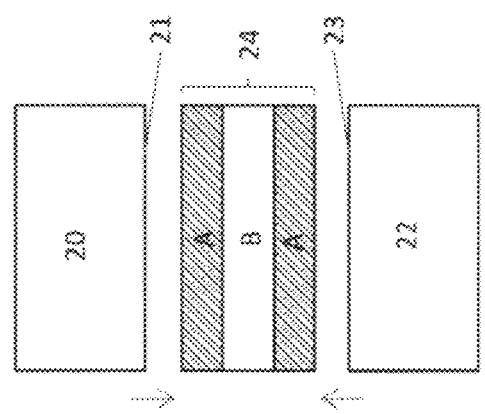
FIG. 3A is a drawing as seen from the side schematically illustrating an example embodiment of forming the sandwiched structure according to the invention.

The boundary layer consisting of the mixture of the binary system according to the invention may be formed in any method known or conceivable to a person skilled in the art. One possible example embodiment of a method for forming the joint according to the first and second aspect of the invention is illustrated schematically in FIGS. 3a) and 3b). In FIG. 3a), a first component is shown schematically as a rectangle marked with reference number 20. The first component 20 is about to make contact between its bonding surface 21 with a preform of the bonding layer, which in this case consists of a sandwiched structure of an upper layer of component A, an intermediate layer of component B and a lower layer of component A. The total amounts of A and B in the sandwiched structure, marked with reference number 24, is adjusted such that the overall composition, $C_0$, is within one of the intervals given above for the first and second aspect of the invention. A second component, which is to be bonded to the first component is shown as a rectangle marked with reference number 22 is about to be made into contact between its bonding surface 23 to the same preform 24 of the bonding layer. Alternatively, the sandwiched structure may be formed by having component A interposed between two layers of component B. This is advantageous in cases where component B has a lower melting point than component A. When the bonding surfaces 21, 23 of the first 20 and the second 22 object, respectttively are in abutment with the preform 24, the sandwiched structure is heated at a temperature at which the components A and B forms the load carrying coherent and continuous single-phased solid solution of either the α-phase or the β-phase of the joint according to the present invention by interdiffusion. The resulting structure is shown schematically in FIG. 3b) where the two-phased mixture of either a single-phase solid solution α-phase and a liquid phase of A and B components, or alternatively a two-phased mixture of a single-phase solid solution β-phase and a liquid phase of A and B components is marked with reference number 25.

Figure 4B:
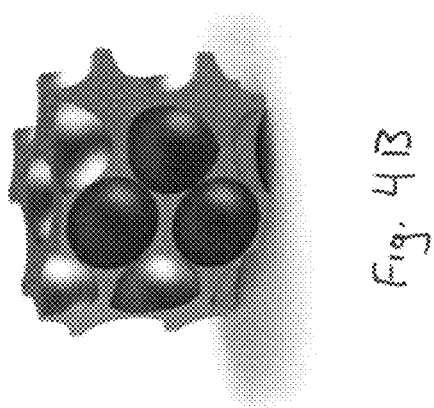
FIGS. 4A and 4B are drawings illustrating example embodiments of possible configurations of the coherent and continuous load carrying structure of the joint according to the invention.
Figure 4A:
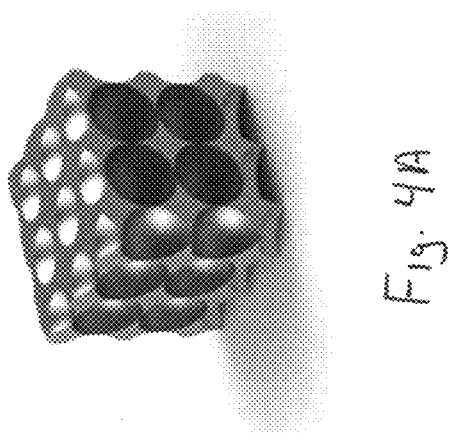

As mentioned, the liquid phase in the two-phased mixture of the bonding layer may be dispersed as more or less equal sized spherical phases in a matrix of the single-phase solid solution (of either α-phase or β-phase). FIG. 4a) is a drawing showing the resulting load carrying coherent and continuous single-phased solid solution of either the α-phase or the β-phase of the joint according to the present invention when the more or less equal sized spherical phases in a matrix of the single-phase solid solution (indicated as empty holes in the figure) is cubic packed, in which case the fraction $f_\alpha$ or $f_\beta$ is 0.48. FIG. 4b) shows another possible configuration of the load carrying coherent and continuous single-phased solid solution of either the α-phase or the β-phase of the joint according to the present invention resulting from rhombohedral packing of the more or less equal sized spherical phases in a matrix of the single-phase solid solution. In the latter case the fraction $f_\alpha$ or $f_\beta$ is 0.26.

The invention according to the first and second aspect may apply any conceivable and practical thickness of the bonding layer of the joint according to the present invention. The actual thickness may vary by several orders of magnitude depending on which binary system being applied and to which application the joint is applied. In practice, the thickness of the bonding layer may advantageously be in one of the following ranges: from 1 to 1000 μm, from 2 to 800 μm, from 3 to 600 μm, from 5 to 400 μm, from 6 to 200 μm, from 7 to 100 μm, from 8 to 50 μm, from 9 to 30 μm, or from 10 to 20 μm.

The binary system to be shaped into the bonding layer of the joint according to the present invention may be any mixture, either chemically of physically mixture, of two components which upon heat treatment transforms by interdiffusion into the two-phase field mixture where one of the phases is a coherent and continuous load carrying structure of either the α-phase or the β-phase. The sandwiched structure which is to be heat treated for forming the joint according to the invention, comprising the first and second solid objects having an interposed layer of the binary system between them, may be obtained in any known or conceivable manner. For instance by having the components A and B in the form of a stack of interposed solid sheet materials as shown schematically in FIG. 3a), in the form of a layer of a powder mixture of particles of the A-component and the B-component, a combination of powder and sheet materials etc. Preferably, the bonding layer of the sandwiched structure comprises a number of thin sheets of the A-component interposed in an alternating pattern with a number of thin sheets of the B-component, as shown schematically in FIG. 3a) in the case of two sheets of A-component and one sheet of B-component. It may be applied a considerably higher number of sheets of both the A- and B-component than shown in FIG. 3a) to enhance the contact area between the components and thus reduce the required interdiffusion time to form the coherent and continuous load carrying structure. Alternatively, it is also envisioned using a number of sheets comprising sheets of a eutectic composition of A and B interposed between sheets of either the A- or the B-component.

Furthermore, it may be advantageous to include one or more adhesion layer(s) interposed between the bonding surface 21, 23 of the first and second object respectively, and the joint 25 according to the invention. Likewise, there may also be advantageous to include at least one diffusion-barrier layer in cases where interdiffusion between joint and object need to be restricted. An adjacent depletion layer may also be included for further concentration control of the final joint composition. The depletion layer may also be used for process control improving diffusion rates and process times. The present invention may include any known or conceivable material for the adhesion, the diffusion-barrier or depletion layer.

The term "first or second object" as used herein, means any physical object which is to be bonded together materials such as e.g.; Si, SiC, GaAs, GaN, (SOI), Alumina, AlN, $Si_3N_4$, glass, Kovar, Cu, Al, etc., and/or components such as e.g.; MEMS, transistors, substrates, resistance condenser, IC, diodes, etc.

Example Embodiments of the Invention

The invention will be described in further detail by way of example embodiments of a joint according to the invention.

First Example Embodiment

The joint according to the first example embodiment of the invention is a Au rich Au—Ge binary system bonding together a first object of SiC to a second object of $Si_3N_4$.

Materials

Figure 5:
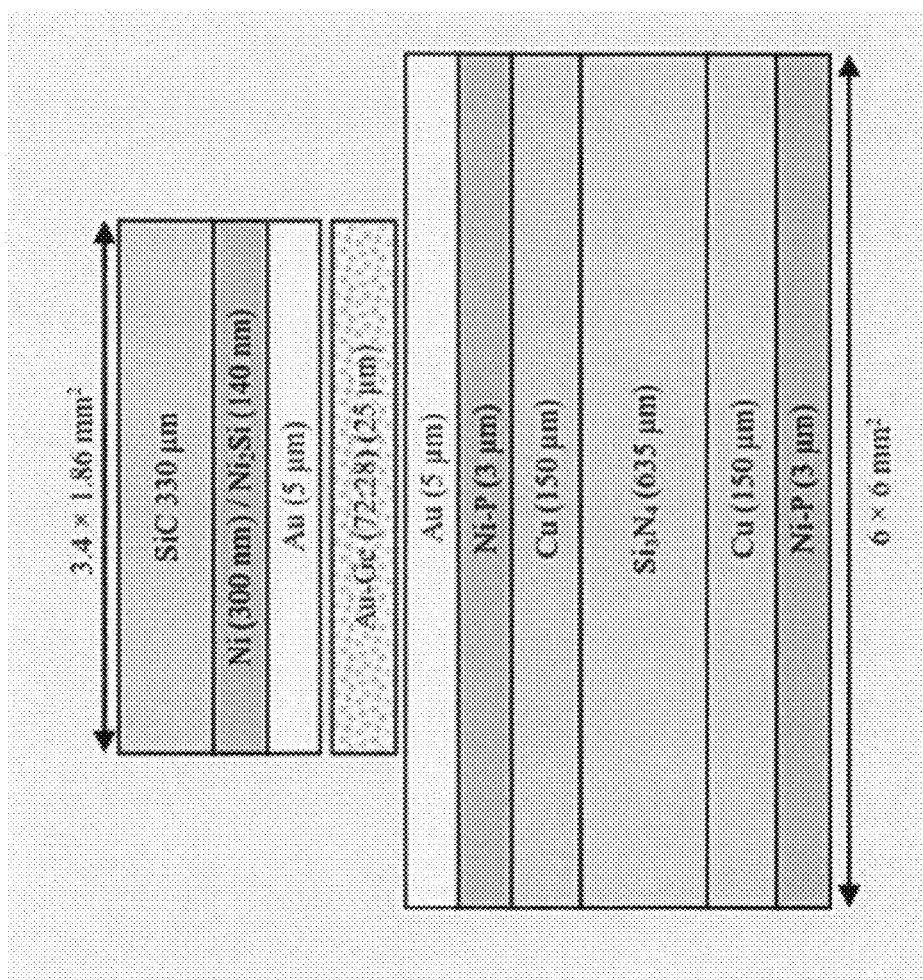
FIG. 5 is a drawing seen from the side schematically illustrating an example embodiment of the present invention.

A eutectic AuGe preform was sandwiched between a dummy chip of SiC (Bi-polar junction transistor or BJT) and a $Si_3N_4$ substrate. The chip had sputtered $Ni_2Si$ (140 nm)/Ni (300 nm)/Au (100 nm) metallization. The substrates had active metal-bonded (AMB) Cu (150 μm) conductors which were plated with Ni—P (7 wt % P). A symmetric metallization (Cu/Ni—P) was present on both front and backside of the substrate to minimize warpage. Both chips and substrates were electroplated with a uniform 5 μm Au layer, using a gold cyanide solution at a temperature range of 333 K to 338 K (60° C. to 65° C.) and a current density of 2.7 mA/cm. The substrates were diced in 6×6 mm² samples, while the chips were diced in 3.4×1.86 mm² samples after plating. A 25 μm thick, 1.86 mm wide and 3.4 mm deep commercial preform from Goodfellow with a eutectic Au—Ge overall composition was used (Au 72 atom % and 28 atom % Ge). The material stack is illustrated in FIG. 5. The total amount of Au and Ge in this binary system, as seen in FIG. 5, i.e. the 5 μm thick gold layer on the dummy chip, the 5 μm thick gold layer on the $Si_3N_4$ substrate, and the 25 μm thick layer of eutectic Au—Ge preform, was 3.08 mg Au and 0.13 mg Ge, corresponding to an overall composition of 11.5 atom % Ge and 88.5 atom % Au.

Fabrication

The chip and preform was manually aligned on to top of the substrate. The stack was then placed onto a hot plate. The bond process was carried out in a dry nitrogen environment in a custom-made bonder. A hot plate from Harry Gestigkeit GmbH PZ 28-3TD with a PR5-3T programmer was used to control the process temperature. It was raised above the eutectic melting temperature; around 360° C. The total time above the eutectic temperature was around 6 min to provide enough time for the liquid and solid diffusion processes to take place properly. A lead was used to create a bond pressure of approximately 1000 kPa. The applied pressure squeezed excess material out from the bond interface, thus minimizing the active volume of eutectic material for the interdiffusion process forming the joint. The pressure also secured a thermomechanical contact between chip and substrate. The temperature was then slowly reduced to room temperature in the subsequent 4 hours. The temperature was measured with a J-type thermocouple integrated into the lead on top of the chip. Complete melting (reflow) of the preform was measured by measuring the displacement of the lead during bonding with a µm displacement probe (TESA).

13 samples were prepared, with slightly varying process parameters. In addition, one sample was prepared exchanging the chip with an identical substrate as the one depicted in FIG. 5, i.e. forming a completely symmetric system with a highly reduced CTE mismatch.

Bond Configuration

The joint was built up by using a stack of different materials layers filling specific purposes. The Ni layer has a combined function. It provides a basic diffusion barrier between adjacent metal layers and as a depletion layer for reducing solute concentration in the final bond. To provide seed material for the final bond material composition, Au was prepared for the bond layers. The eutectic Au—Ge preform provides good wetting properties during the liquid phase.

Characterization

Process completion verification was evaluated by reheating fabricated samples beyond the eutectic temperature of the initial preform while applying a small shear force to reveal possible joint reflow. The maximum tested temperature reached up to about 600° C.

The bond quality was tested by destructive shear testing (Nordson Dage 4000 Plus shear tester with a 200 kgf load cartridge).

Fractography was then performed by visual inspection of the fracture surfaces in an optical microscope (Olympus). The reported strength is normalized to the actual bonded area. The failure mode was classified as adhesive fracture, cohesive fracture or a mix of both. Adhesive means that the fracture surface was between adjacent metal layers, e.g. Ni and Au—Ge. Cohesive means the fracture were located to the bulk in a single layer.

Cross-section of 'as bonded' samples were evaluated with use of optical microscopy (Neophot 32) and scanning electron microscopy (SEM) (FEI Nova NanoSEM 650). Samples were prepared for cross-section by grinding and polishing. The grinding stopped at 2000 grade before preparation was continued with polishing using a cloth and a 5 µm diamond paste. Before SEM was conducted, samples were coated with a thin layer of carbon.

The joint composition was evaluated by energy-dispersive X-ray spectroscopy (EDS or EDX) (Oxford X-MAX 50).

SEM-photographs taken of one sample of a joint having been subject to an initial heating above the solidus temperature (i.e. the eutectic temperature of approx. 360° C.) for a few minutes and then cooled to room temperature, and one sample of a joint having been subject to an initial heating above the solidus temperature for a few minutes and then cooled to about 300° C. and maintained at that temperature for 4 hours, are shown in FIGS. 7a) and 7b), respectively.

The morphological change of the binary system due to the heating is illustrated more clearly in the photograph of the sample having been annealed for 4 hours at 300° C., as compared to the sample not annealed after the initial heating. This morphological change is believed to be the porous, coherent and continuous structure of a single-phased solid solution of the A- and B-components according to the invention. This assumption is strengthened by stress tests mentioned above and the detachment results given below.

Reliability

Residual strength after extreme thermal shock treatment was evaluated for one sample. The sample was heated up to approximately 600° C. in approximately 10 min. Then it was dropped into a glass of ice water at 0° C. This cycle was then repeated once more. The sample was then shear tested and fractography was performed.

Process Completion

None of the reheated joints showed any signs of reflow when the temperature exceeded 360° C.

Bond Strength

The strength of the fabricated samples varied between a few MPa to approximately 50 MPa. The symmetrical sample with two substrates joint together measured a strength of more than 56 MPa, which was the maximum load (200 kgf) that the shear tester could apply, i.e. the sample never fractured.

Fractography

Fractography showed that most samples had reflowed properly during bonding. Excess preform material was present around the samples. These samples showed cohesive fracture surfaces of the joint itself. Samples without this excess perform material present around the samples showed fracture surfaces interpreted as adhesive fracture between preform and one adjacent Au layer. A few samples also showed that partial wetting at the bond interface had occurred, reducing the effective bonded area.

Cross-Sectioning

Figure 6:
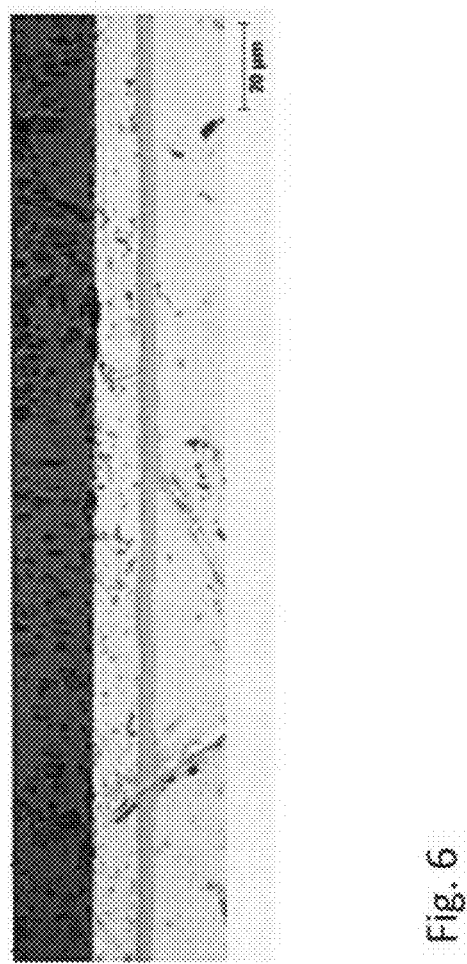
FIG. 6 is an optical micrograph of cross-section of a joint of an example embodiment of the present invention.

Cross-sections of the bonded samples typically show uniform bonds without a visible bond line (cf. FIG. 6). The final bond thicknesses were found to be 9-10 µm. The micrographs further showed that at least two distinct material compositions were present in the joint. Further examination revealed that a diffusion process between the bond materials, i.e. Au or Ge, and the adjacent Ni—P layer had occurred. In a few places, structures that appeared to be lateral cracks were found.

Joint Composition Analysis by SEM and EDX of cross-sectioned samples showed that the joint mainly consisted of an overall Au rich Au—Ge composition with a Ge concentration between 4 at-% and 5 at-%. It was further observed that Ge were isolated in small 'regions' inside an otherwise α-phase (Au with dissolved Ge). Elemental analysis further disclosed that Ge had diffused through the Au—Ge bond forming an intermetallic compound (IMC) with the adjacent Ni. SEM and EDS confirmed that it was excess preform that was present around the bonded samples.

Reliability

The residual strength of the sample exposed to the thermal shock treatment was measured to 12.3 MPa. Subsequent fractography showed that the fracture mode had changed to an adhesive fracture in the adhesion layer on the chip side.

Conclusion

This illustrate a joint with significant strength above solidus with remarkable thermal cycling potential.

Second Example Embodiment

The joint according to the second example embodiment of the invention is a Au rich Au—Ge binary system bonding together a first object of Si to a second object of Si.

Materials

Figure 8:
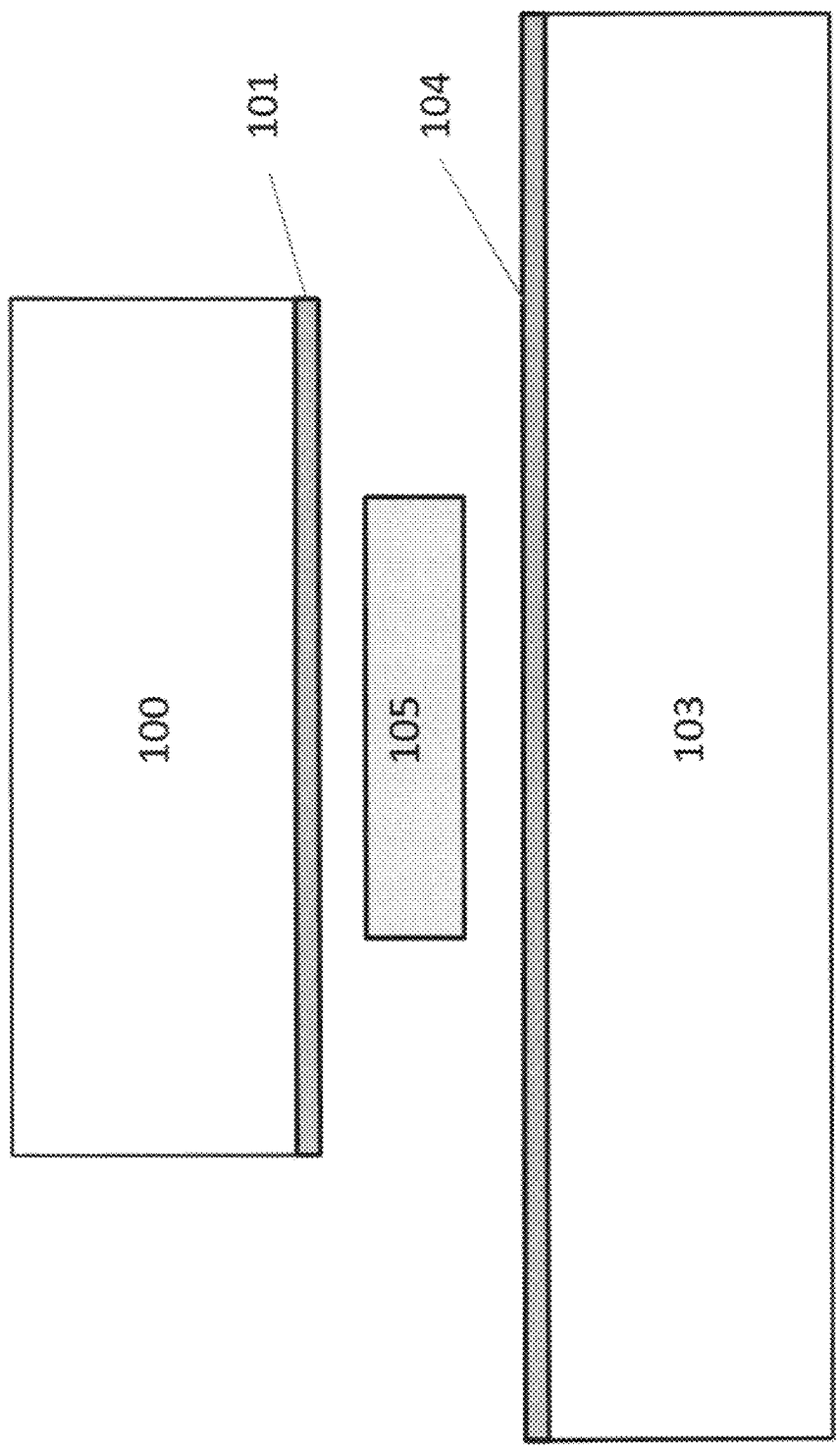
FIG. 8 is a schematic illustration as seen from the side of a binary Au—Ge system applied in an example embodiment of the invention.

A dummy chip of silicon and a dummy substrate of silicon having a 150 nm thick TiW-layer on its bonding side, was bonded together by a binary Au—Ge system in-between the silicon substrates. The Au—Ge system had an overall composition of 5.4 atom % Ge before heat treatment and formation of the bond. The stack of the two silicon substrates is schematically illustrated seen from the side in FIG. 8.

The dummy chip of dimensions 1.9×1.9 mm$^2$ and thickness of 525 µm is illustrated as box 100 on the figure, its 2.8 µm thick layer of gold is shown as layer 101, the 25 µm thick, 1 mm wide and 0.7 mm deep preform of eutectic Au—Ge is shown as box 105, the dummy substrate of dimensions 3.9×3.9 mm$^2$ and thickness of 525 µm is shown as box 103, and its 2.8 µm thick layer of gold is shown as layer 104.

The eutectic Au—Ge preform was sandwiched between the dummy chip of Si and the dummy substrate of Si. The 25 µm thick, 1 mm wide and 0.7 mm deep commercial preform was supplied from Goodfellow with a eutectic Au—Ge composition of 72 atom % Au and 28 atom % Ge.

Fabrication

The chip and preform was manually aligned on to top of the substrate forming a symmetrical Si/Au/Au—Ge/Au/Si structure and placed onto a heating plate of a Budatec bonder VS160S equipped with a custom made sample holder with a spring for squeezing the structure together. The bond process was carried out in vacuum. The temperature was raised above the eutectic melting temperature to around 380° C. and then lowered to around 330° C. and maintained at this temperature for up to 10 hours. The applied pressure, approximately 2 MPa, squeezed excess material out from the bond interface, thus minimizing the active volume of eutectic material for the interdiffusion process forming the joint. The pressure also secured a thermomechanical contact between chip and substrate. The subsequent annealing step was performed at 330° C. for 10 hours to form the desired morphology; a solid and coherent porous structure above solidus.

Characterization

An integrity test of the fabricated bond is performed by attaching the fabricated sample on a vertical surface (a hot plate from Watlow; Ultramic 600) in vacuum were the temperature of the surface could be controlled. A weight was applied to the structure creating a shear force over the bond in the range of 20-50 kPa. The temperature was raised at a rate of 30° C./min up to a maximum of 600° C. or until the chip detached from the substrate. The fabricated bond of this example embodiment was observed to not detach at temperatures in the bond when heated to 600° C., proving that the bond according to the invention remains its integrity well into the "mushy region", i.e. well above the solidus (eutectic) temperature of about 360° C.

Cross-section of 'as bonded' samples were analyzed with use of optical microscopy (II Neophot 32) and scanning electron microscopy (SEM) (Hitachi SU8320).

Samples were prepared for cross-section by dicing and Ar ion-milling (Hitachi IM4000). The joint composition was evaluated by energy-dispersive X-ray spectroscopy (EDX) (Oxford Silicon Drift Detector-XmaxN).

Joint Composition

Figure 9:
FIG. 9 is a optical photography of a bond according to the invention made in the Au—Ge system.
Figure 10:
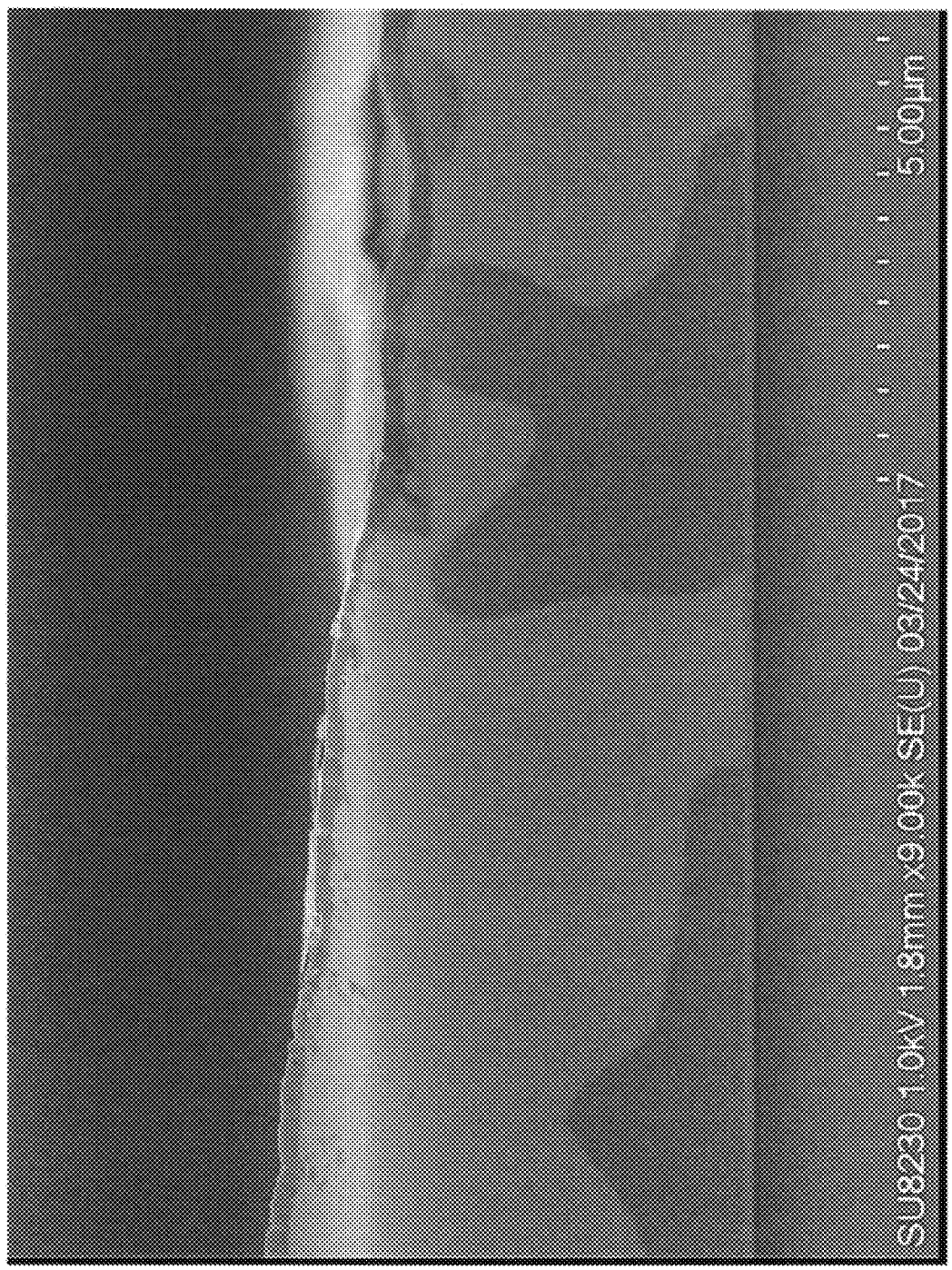
FIG. 10 is a SEM-photograph of a section of the same bond shown in FIG. 9.

Analysis by SEM and EDX of the bonding layer of the sample showed that the bond mainly consisted of an overall Au rich Au—Ge composition with Ge concentration of around 11 at %. It was further observed that the desired morphology had been achieved by Ge-phase having been isolated in small 'regions' inside an otherwise α-phase (Au with dissolved Ge) without any significant regions showing an eutectic morphology. This morphological change is seen clearly in FIG. 9 which is a optical photograph of the bonding layer taken after (low-temperature) stress tests causing the bond to break, such that the photograph shows only a section of the dummy silicon substrate and its remains of the bonding layer. In the photograph it can clearly be seen that the bonding layer has changed morphologically from the eutectic Au—Ge by having a fraction of the germanium segregating into grey regions of a phase high in Ge. The yellow phase is a gold rich α-phase which is believed to be the bonding structure according to the invention. That the gray regions are high in germanium and the yellow region is gold rich α-phase is confirmed by SEM and EDX analysis. FIG. 10 is a SEM-photograph of a section of the region shown in FIG. 9 (shown mirror inverted). The analysis found that the overall composition of the bonding layer was 11 atom % Ge.

Conclusion

This indicate a coexisting structural α phase (Au) with a liquid phase (Au—Ge) above solidus. It further demonstrates a final joint with significant strength above the solidus.

Third Example Embodiment

The joint according to the third example embodiment of the invention is a In—Si binary system bonding together a first object of Si to a second object of Si.

Materials

A 1µµm thick pure In layer was thermally evaporated onto the bond surfaces of a dummy chip and a dummy substrate of Si. The substrate was diced in 3.9×3.9 mm$^2$ samples, while the chip was diced in 1.9×1.9 mm$^2$ samples after In deposition.

Both the dummy chip and the dummy substrate were 525 µm thick. The In—Si system had an overall composition of 99.86 atom % Si before heat treatment and formation of the bond.

Fabrication The chip was manually aligned on top of the substrates forming a symmetrical Si/In/In/Si structure. The stack was then placed onto a hot plate (Budatec bonder VS160S). The bond process was carried out in vacuum. Both the process temperature and dwell time was varied for the fabricated samples. The temperature was raised to about 170° C. The total time (dwell time) above the eutectic temperature was 5 min, followed by an annealing at 10 hours at 135° C. The custom made sample holder (cf. second example) exerted a pressure of about 2 MPa. The pressure secured a thermomechanical contact between chip and substrate.

Detachment Temperature

The sample was exposed to a similar integrity test as given above for experiment 2. The bond demonstrated significant structural integrity at 400° C., well above the solidus (eutectic) temperature of 157° C. of the In—Si system.

Fourth Example Embodiment

The joint according to the fourth example embodiment of the invention is a Si—Sn binary system bonding together a first object of Si to a second object of Si.

Materials

A 200 nm thick pure Sn layer was thermally evaporated onto the bond surfaces of a dummy chip and a dummy substrate of Si. The substrate was diced in 3.9×3.9 mm$^2$ samples, while the chip was diced in 1.9×1.9 mm² samples after Sn deposition. Both the dummy chip and the dummy substrate were 525 μm thick. The Si—Sn system had an overall composition of 99.97 atom % Si before heat treatment and formation of the bond.

Fabrication

The chip was manually aligned on top of the substrates forming a symmetrical Si/Sn/Sn/Si structure. The stack was then placed onto the aforementioned hotplate (cf. example 2 and 3) and sample holder. The bond process was carried out in vacuum. Both the process temperature and dwell time was varied for the fabricated samples. The temperature was raised to about 250° C. The total time (dwell time) above the eutectic temperature was 1 min, followed by an annealing for 4-5 hours at approximately 200° C. A spring in the sample holder created a contact pressure of about 2 MPa securing a thermomechanical contact between chip and substrate.

Detachment Temperature

The sample was exposed to a similar integrity test as given above for experiment 2. The bond demonstrated significant structural integrity at 400° C., well above the solidus (eutectic) temperature of 232° C. of the Si—Sn system.

REFERENCES

[1] A. A. Ahkubekov, S. N. Ahkubekova, O. L. Enaldieva, T. A. Orkvasov and V. A. Sozaev, "The influence of small impurity additions and direct electric current on the kinetics of contact melting in metals," *Journal of Physics: Conference Series*, vol. 98, no. 062031, 2008.

[2] T. A. Tollefsen, A. Larsson, O. M. Lovvik, and K. Aasmundtveit, "Au—Sn SLID Bonding—Properties and Possibilities," *Metallurgical and Materials Transactions B*, vol. 43, no. 2, pp. 397-405, April 2012.

[3] AAPG Wiki, an open access resource maintained by the American Association of Petroleum Geologists, an international association of technical professionals, available on the internet: http://wiki.aapg.org/Porosity

The invention claimed is:

1. A joint between a bonding surface of a first solid object and a bonding surface of a second solid object, comprising a bonding layer made of a binary system of components A and B, wherein the binary system is either:
  i) a completely miscible binary system, having an overall composition Co within the range: $C_0=C_{liq}-f_\alpha(C_{liq}-C_\alpha)$
    where;
    $C_{liq}$ is the composition of a liquid phase coexisting with a single-phased solid solution when the binary system is at a temperature $T_1=(T_{liq,A}+T_{liq,B})/2$,
    $C_\alpha$ is the composition of the single-phased solid solution coexisting with the liquid phase when the binary system is at a temperature $T_1$,
    $T_{liq,A}$ is the liquidus temperature of 100% pure component A,
    $T_{liq,B}$ is the liquidus temperature of 100% pure component B,
    and
    $f_\alpha$ is the fraction of single-phased solid solution present in the miscible binary system at temperature $T_1$, and
    $f_\alpha$ is in the range of [0.26, 1), or
  ii) a partly miscible binary system of either hypoeutectic or hypereutectic composition, relative to the binary A-B system, having only three phase fields in its solid state region,
    and if the composition of the partly miscible binary system is hypoeutectic, it has an overall composition $C_0$ in the range: $C_0=C_{liq}-f_\alpha(C_{liq}-C_\alpha)$
    where;
    $C_{liq}$ is the composition of a liquid phase coexisting with an α-phase when the binary system is at a temperature $T_1=(T_{liq,A}+T_{eut})/2$
    $C_\alpha$ is the composition of the α-phase coexisting with the liquid phase when the binary system is at a temperature $T_1=(T_{liq,A}+T_{eut})/2$,
    $T_{liq,A}$ is the melting temperature of 100% pure component A,
    $T_{eut}$ is the eutectic temperature of the eutectic binary system, and
    $f_\alpha$ is the fraction of single-phased solid solution present in the miscible binary system at temperature $T_1$, and
    $f_\alpha$ is in the range of [0.26, 1),
    or if the composition of the partly miscible binary system is hypereutectic, it has an overall composition $C_0$ in the range: $C_o=f_\beta(C_\beta-C_{liq})+C_{liq}$
    where;
    $C_{liq}$ is the composition of a liquid phase coexisting with an β-phase when the binary system is at a temperature $T_1=(T_1=(T_{liq,B}+T_{eut})/2$,
    $C_\beta$ is the composition of the β-phase coexisting with the liquid phase when the binary system is at a temperature $T_1=(T_{liq,B}+T_{eut})/2$,
    $T_{liq,B}$ is the melting temperature of 100% pure component B,
    $T_{eut}$ is the eutectic temperature of the eutectic binary system, and
    $f_\beta$ is the fraction of single-phased solid solution present in the miscible binary system at temperature $T_1$, and
    $f_\beta$ is in the range of [0.26, 1),
  and further wherein
  the binary system of miscible or partly miscible components A and B comprises a porous, coherent and continuous structure of a single-phased solid solution of the A- and B-components being interposed between the bonding surfaces of both the first and second objects, and a second phase of the A- and B-components dispersed in the porous, coherent and continuous structure of the single-phased solid solution of the A- and B-components.

2. The joint according to claim 1, wherein $f_\alpha$ is in the range of [0.36, 1);
  [0.48, 1); [0.60, 1); [0.72, 1); [0.84, 1); [0.95, 1); [0.26, 0.99]; [0.30, 0.98];
  [0.42, 0.96]; [0.52, 0.94]; [0.64, 0.92]; or [0.95, 0.99].

3. The joint according to claim 1, wherein $f_\beta$ is in the range of [0.36, 1);
  [0.48, 1); [0.60, 1); [0.72, 1); [0.84, 1); [0.95, 1); [0.26, 0.99]; [0.30, 0.98];
  [0.42, 0.96]; [0.52, 0.94]; [0.64, 0.92]; or [0.95, 0.99].

4. The joint according to any of claims 1-3, wherein the binary system is a chemical or physical mixture of component A and component B chosen from the group consisting of: Ge—Si, Mo—W, Nb—W, V—W, Ag—Bi, Ag—Cu, Ag—Ge, Ag—Mo, Ag—Pb, Ag—Si, Ag—Ti, Al—Be, Al—Bi, Al—Ga, Al—Ge, Al—N, Al—Sn, Au—Bi, Au—Ge, Au—Mo, Au—Sb, Au—Si, Au—W, Bi—Cu, Bi—Ge, Bi—Ni, Bi—Sn, Cr—Sn, Cu—Si, Fe—In, Ga—Ge, Ga—Si, Ga—Zn, Ge—In, Ge—Pb, Ge—Sb, Ge—Sn, Ge—Zn, In—Si, In—Zn, Pb—W, Pd—W, Sb—Si, Si—Sn, Si—Zn, Sn—Zn, and $SiO_2$—$Al_2O_3$.

5. The joint according to claim 4, wherein the binary system is a chemical or physical mixture of component A and component B chosen from the group consisting of: Al—Ge, Al—Sn, Au—Ge, Au—Si, Bi—Cu, Bi—Ge, Bi—Sn, Ga—Ge, Ge—In, In—Si, and Si—Sn.

6. The joint according to claim 4, wherein the thickness of the bonding layer, before a heat treatment forming the porous, coherent and continuous structure of the single-phased solid solution extending across the bonding layer is applied, is in the range of from: 1 to 1000 µm, 2 to 800 µm, 3 to 600 µm, 5 to 400 µm, 6 to 200 µm, 7 to 100 µm, 8 to 50 µm, 9 to 30 µm, or 10 to 20 µm.

* * * * *